US012588381B2

(12) United States Patent
Jang

(10) Patent No.: US 12,588,381 B2
(45) Date of Patent: Mar. 24, 2026

(54) DISPLAY DEVICE AND METHOD OF MANUFACTURING THE SAME

(71) Applicant: Samsung Display Co., LTD., Yongin-si (KR)

(72) Inventor: Joo Nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 628 days.

(21) Appl. No.: 18/074,568

(22) Filed: Dec. 5, 2022

(65) Prior Publication Data

US 2023/0320157 A1     Oct. 5, 2023

(30) Foreign Application Priority Data

Mar. 31, 2022    (KR) ........................ 10-2022-0040263

(51) Int. Cl.
| | |
|---|---|
| *H10K 59/173* | (2023.01) |
| *H10D 86/40* | (2025.01) |
| *H10D 86/60* | (2025.01) |
| *H10K 59/10* | (2023.01) |
| *H10K 59/80* | (2023.01) |
| *H10K 71/13* | (2023.01) |

(52) U.S. Cl.
CPC ......... *H10K 59/173* (2023.02); *H10D 86/421* (2025.01); *H10D 86/60* (2025.01); *H10K 59/873* (2023.02); *H10K 71/135* (2023.02); *H10K 59/10* (2023.02)

(58) Field of Classification Search
CPC .... H10K 50/844; H10K 59/10; H10K 59/173; H10K 71/135; H10H 20/01; H10H 20/819; H10H 20/84; H10H 20/857; H10D 86/421; H10D 86/60; H01L 25/0753; H01L 25/167
See application file for complete search history.

(56) References Cited

U.S. PATENT DOCUMENTS

| | | | | |
|---|---|---|---|---|
| 2021/0313498 A1* | 10/2021 | Kim | .................... | H01L 25/0753 |
| 2021/0359049 A1* | 11/2021 | Heo | .................... | H10K 59/122 |
| 2022/0069165 A1* | 3/2022 | Shin | .................... | H01L 25/0753 |
| 2022/0085248 A1* | 3/2022 | Kim | .................... | H10H 20/857 |

FOREIGN PATENT DOCUMENTS

KR        10-0459782        12/2004

* cited by examiner

*Primary Examiner* — Shaun M Campbell
(74) *Attorney, Agent, or Firm* — Womble Bond Dickinson (US) LLP

(57)        ABSTRACT

A display device comprises banks spaced apart from each other on a substrate, a first electrode disposed on the banks, a second electrode disposed on the banks and spaced apart from the first electrode, and a light emitting element disposed on the first electrode and the second electrode. The first electrode and the second electrode cover the banks. The first electrode includes a first electrode portion overlapping the banks in a plan view and a first pattern portion separated from the first electrode portion. The second electrode includes a second electrode portion overlapping the banks in a plan view and a second pattern portion separated from the second electrode portion.

20 Claims, 15 Drawing Sheets

EL: AE, ED, CE

PX : SP1, SP2, SP3

AEb          CEb

DISPLAY DEVICE AND METHOD OF MANUFACTURING THE SAME

CROSS-REFERENCE TO RELATED APPLICATION

This application claims priority to and benefits of Korean Patent Application No. 10-2022-0040263 under 35 U.S.C. § 119, filed in the Korean Intellectual Property Office on Mar. 31, 2022, the entire contents of which are incorporated herein by reference.

BACKGROUND

1. Technical Field

The disclosure relates to a display device and a method of manufacturing the same, which is capable of improving alignment to prevent eccentricity of a light emitting element.

2. Description of the Related Art

The importance of display devices as communication media, has been emphasized because of the increasing developments of information technology. For example, the display device has been applied to various electronic devices such as smartphones, digital cameras, laptop computers, navigation devices, and smart televisions. The display device may be a flat panel display device such as a liquid crystal display device, a field emission display device, or an organic light emitting display device. Among the flat panel display devices, the light emitting display device may include a light emitting element capable of emitting light independently of a separate light source. Thus, the flat panel display devices display an image without a light emitting part providing light to the display panel.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device capable of improving alignment to prevent eccentricity of a light emitting element.

Embodiments also provide a method of manufacturing a display device, which is capable of improving alignment to prevent eccentricity of a light emitting element.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure, a display device comprising banks spaced apart from each other on a substrate, a first electrode disposed on the banks, a second electrode disposed on the banks, and spaced apart from the first electrode, and a light emitting element disposed on the first electrode and the second electrode. The first electrode and the second electrode cover the banks. The first electrode includes a first electrode portion overlapping the banks in a plan view, and a first pattern portion separated from the first electrode portion. The second electrode includes a second electrode portion overlapping the banks, and a second pattern portion separated from the second electrode portion.

The first pattern portion may do not overlap the banks in a plan view, and the second pattern portion may do not overlap the banks in a plan view.

The first pattern portion may overlap the light emitting element in a plan view, and the second pattern portion may overlap the light emitting element in a plan view.

The first pattern portion and the first electrode portion may be electrically separated from each other.

The first electrode portion and the first pattern portion may be independently driven.

The second pattern portion and the second electrode portion may be electrically separated from each other.

The second electrode portion and the second pattern portion may be independently driven.

The first pattern portion may be disposed between the first electrode portion and the second pattern portion, and the second pattern portion may be disposed between the second electrode portion and the first pattern portion.

A separation distance between the first pattern portion and the second pattern portion may be in a range of about 0.7 times to about 1 time a length of the light emitting element.

A width of the first pattern portion and a width of the second pattern portion may be equal to or smaller than about 0.2 times a length of the light emitting element.

The display device may further comprise a first contact electrode electrically connected to the first electrode and in contact with an end of the light emitting element.

The display device may further comprise a second contact electrode electrically connected to the second electrode and in contact with another end of the light emitting element.

According to an embodiment of the disclosure, a display device comprising banks spaced apart from each other on a substrate, a first electrode disposed on the substrate, a second electrode disposed on the substrate and spaced apart from the first electrode, and a light emitting element disposed on the first electrode and the second electrode. The first electrode and the second electrode do not overlap the banks, respectively.

The first pattern portion may overlap the light emitting element in a plan view, and the second pattern portion may overlap the light emitting element in a plan view.

A separation distance between the first pattern portion and the second pattern portion may be in a range of 0.7 times to about 1 time a length of the light emitting element.

A width of the first pattern portion and a width of the second pattern portion may be equal to or smaller than about 0.2 times a length of the light emitting element, respectively.

According to an embodiment of the disclosure, a method of manufacturing a display device, the method comprising preparing a target substrate including banks spaced apart from each other on a substrate, a first electrode disposed on the banks and including a first electrode portion overlapping the banks in a plan view and a first pattern portion separated from the first electrode portion, and a second electrode disposed on the banks, spaced apart from each other, and including a second electrode portion overlapping the banks in a plan view and a second pattern portion separated from the second electrode portion, and jetting ink including a plurality of light emitting elements disposed on the first electrode and the second electrode. The first and second electrodes cover the banks.

The method may further comprise, after the jetting of the ink including the plurality of light emitting elements disposed on the first electrode and the second electrode, applying a first power voltage to the first electrode portion and the first pattern portion, and applying a second power voltage to the second electrode portion and the second pattern portion.

The method may further comprise, after the applying of the first power voltage to the first electrode portion and the first pattern portion, and the applying of the second power voltage to the second electrode portion and the second pattern portion, applying the first power voltage only to the first pattern portion, and applying the second power voltage only to the second pattern portion.

The first pattern portion may be disposed between the first electrode portion and the second pattern portion, and the second pattern portion may be disposed between the second electrode portion and the first pattern portion.

Details of other embodiments are included in the detailed description and drawings.

According to the display device and the method of manufacturing the display device according to the embodiments, the alignment of the light emitting elements may be improved, and the eccentricity of the light emitting elements may be prevented.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

An additional appreciation according to the disclosure will become more apparent by describing in detail the embodiments thereof with reference to the accompanying drawings, wherein.

DETAILED DESCRIPTION OF THE EMBODIMENTS

Figure 1:
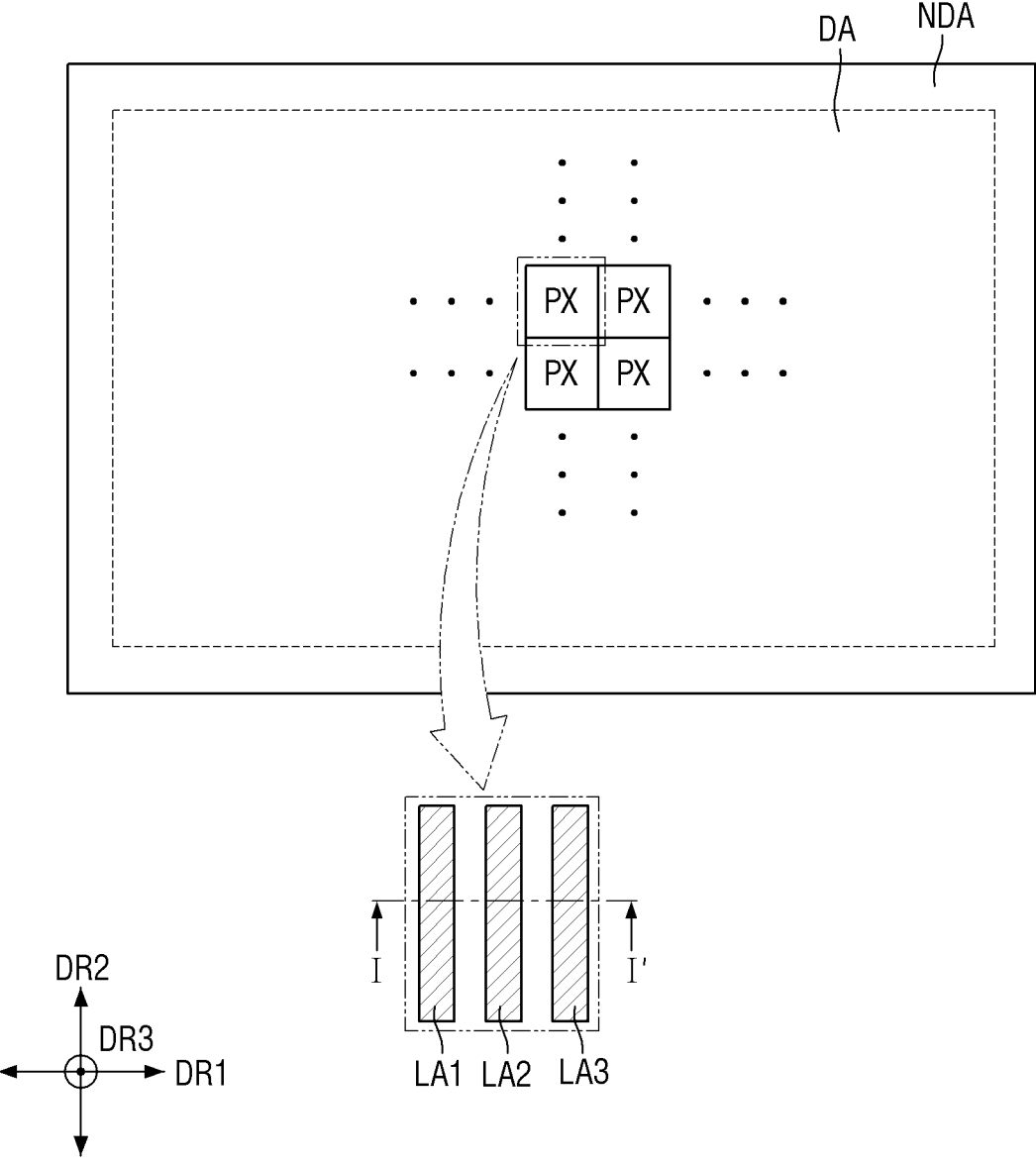
FIG. 1 is a schematic plan view illustrating a display device according to an embodiment.

In the following description, for the purpose of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various types of elements, these elements should not be limited by these terms. These terms are only used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Further-more, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments are described with reference to the accompanying drawings.

FIG. 1 is a schematic plan view illustrating a display device according to an embodiment.

Referring to FIG. 1, a display device according to an embodiment may have a rectangular planar shape. However, the planar shape of the display device is not limited thereto and may have a square, circular, oval, or other polygonal shapes. Hereinafter, for convenience of explanation, description of the display device having the rectangular planar shape is provided below.

The display device may include a display panel providing a display screen. Examples of the display panel may include an inorganic light emitting diode display panel, an organic light emitting display panel, a quantum dot light emitting display panel, a plasma display panel, a field emission display panel, and the like. Hereinafter, for convenience of explanation, description of the display device including the inorganic light emitting diode display panel is provided below. However, the disclosure is not limited thereto, and the same technical idea may be applied to other display panels if applicable.

The display device may include a display area DA and a non-display area NDA. The display area DA may include pixels PX to display an image. The pixels PX may be arranged in a matrix manner. The non-display area NDA may be adjacent to (e.g., be disposed around) the display area DA and be adjacent to (e.g., surround) the display area DA, and may not display an image. The non-display area NDA may completely surround the display area DA in a plan view. The display area DA may also be referred to as an active area, and the non-display area NDA may also be referred to as a non-active area. The display area DA may occupy a center of the display device.

The non-display area NDA may be positioned on another side of the display area DA in a first direction DR1, a side of the display area DA in the first direction DR1, a side of the display area DA in a second direction DR2, and another side of the display area DA in the second direction DR2, respectively. For example, the non-display area NDA may be positioned on four sides of the display area DA in the first direction DR1 and the second direction DR2. However, the non-display area NDA is not limited thereto. In other embodiments, multiple non-display areas NDA may also be positioned only on the side and the another side of the display area DA in the first direction DR1, or may also be positioned only on the side and the another side thereof in the second direction DR2. Lines or circuit drivers included in the display device may be disposed in each of the non-display areas NDA, or external devices may be mounted thereon.

Referring to the enlarged view of FIG. 1, each of the pixels PX of the display device may include light emitting areas LA1, LA2, and LA3 defined by a pixel defining layer, and may emit light having a peak wavelength (e.g., a predetermined or selectable peak wavelength) through the light emitting areas LA1, LA2, and LA3. For example, the display area DA of the display device may include a first light emitting area LA1, a second light emitting area LA2, and a third light emitting area LA3. Each of the first to third light emitting areas LA1, LA2, and LA3 may be an area in which light generated by a light emitting element of the display device is emitted to the outside of the display device.

The first to third light emitting areas LA1, LA2, and LA3 may emit the light having the peak wavelength (e.g., the predetermined or selectable peak wavelength) to the outside of the display device. The first light emitting area LA1 may emit light of a first color, the second light emitting area LA2 may emit light of a second color, and the third light emitting area LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm, but the disclosure is not limited thereto.

The display area DA of the display device may include a light blocking area between the light emitting areas LA1, LA2, and LA3 adjacent to each other. For example, the light blocking area between the light emitting areas may be adjacent to (e.g., surround) the first to third light emitting areas LA1, LA2, and LA3.

Figure 2:
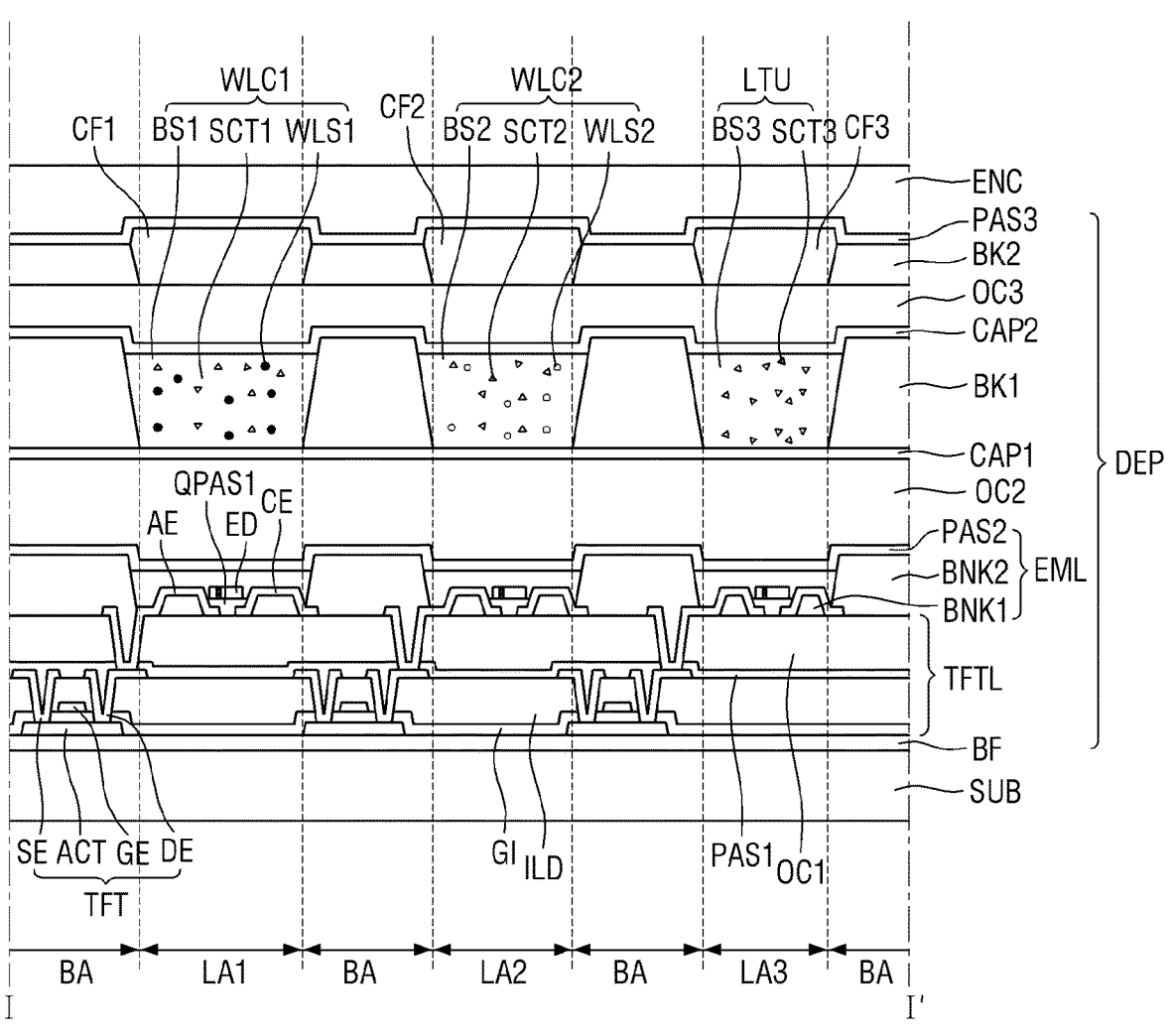
FIG. 2 is a schematic cross-sectional view taken along line I-I' of an enlarged view of FIG. 1.

FIG. 2 is a schematic cross-sectional view taken along line I-I' of an enlarged view of FIG. 1.

Referring to FIG. 2, the display device may include a substrate SUB disposed across the display area DA and the non-display area NDA, a display element layer DEP on the substrate SUB disposed in the display area DA, and an encapsulation member ENC disposed across the display area DA and the non-display area NDA and sealing the display element layer DEP.

The substrate SUB may be made of an insulating material such as a polymer resin. The insulating material of the substrate SUB may include, for example, polyimide (PI), but is not limited thereto.

The display element layer DEP may include a buffer layer BF, a thin film transistor layer TFTL, a light emitting element layer EML, a second planarization layer OC2, a first capping layer CAP1, a first light blocking member BK1, a first wavelength conversion portion WLC1, a second wavelength conversion portion WLC2, a light transmission portion LTU, a second capping layer CAP2, a third planarization layer OC3, a second light blocking member BK2, a first color filter CF1, a second color filter CF2, a third color filter CF3, a third passivation layer PAS3, and an encapsulation member ENC.

The buffer layer BF may be disposed on the substrate SUB. The buffer layer BF may be formed of an inorganic film capable of preventing permeation of air or moisture.

The thin film transistor layer TFTL may include a thin film transistor TFT, a gate insulating film GI, an interlayer insulating film ILD, a first passivation layer PAS1, and a first planarization layer OC1.

The thin film transistor TFT may be disposed on the buffer layer BF, and may constitute a pixel circuit of each of the pixels PX.

The thin film transistor TFT may include a semiconductor layer ACT, a gate electrode GE, a source electrode SE, and a drain electrode DE. The semiconductor layer ACT may be provided on the buffer layer BF. The semiconductor layer ACT may overlap the gate electrode GE, the source electrode SE, and the drain electrode DE in a plan view. The semiconductor layer ACT may be in direct contact with the source electrode SE and the drain electrode DE, and may face the gate electrode GE with the gate insulating film GI interposed therebetween.

The gate electrode GE may be disposed on an upper side of the gate insulating film GI. The gate electrode GE may overlap the semiconductor layer ACT in a plan view, and the gate insulating film GI may be interposed between the gate electrode GE and the semiconductor layer ACT.

The source electrode SE and the drain electrode DE may be spaced apart from each other on the interlayer insulating film ILD. The source electrode SE may be in contact with an end of the semiconductor layer ACT through a contact hole provided in (or penetrating through) the gate insulating film GI and the interlayer insulating film ILD. The drain electrode DE may be in contact with another end of the semiconductor layer ACT through a contact hole provided in (or penetrating through) the gate insulating film GI and the interlayer insulating film ILD. The drain electrode DE may be electrically connected to a first electrode AE of a light emitting member EL through a contact hole provided in (or penetrating through) the first passivation layer PAS1 and the first planarization layer OC1.

The gate insulating film GI may be provided on an upper side of the semiconductor layer ACT. For example, the gate insulating film GI may be disposed on the upper side of the semiconductor layer ACT and the buffer layer BF, and may electrically insulate the semiconductor layer ACT and the gate electrode GE. The gate insulating film GI may include a contact hole through which the source electrode SE penetrates and a contact hole through which the drain electrode DE penetrates.

The interlayer insulating film ILD may be disposed on an upper side of the gate electrode GE. For example, the interlayer insulating film ILD may include a contact hole through which the source electrode SE penetrates and a contact hole through which the drain electrode DE penetrates.

The first passivation layer PAS1 may be provided on an upper side of the thin film transistor TFT and protect the thin film transistor TFT. For example, the first passivation layer PAS1 may include a contact hole through which the first electrode AE penetrates.

The first planarization layer OC1 may be provided on an upper side of the first passivation layer PAS1 and planarize an upper end of the thin film transistor TFT. For example, the first planarization layer OC1 may include a contact hole through which the first electrode AE of the light emitting member EL penetrates.

The light emitting element layer EML may include a light emitting member EL, a first bank BNK1, a second bank BNK2, a first element insulating layer QPAS1, and a second passivation layer PAS2.

The light emitting member EL may be provided on the thin film transistor TFT. The light emitting member EL may include a first electrode AE, a second electrode CE, and a light emitting element ED.

The first electrode AE may be provided on an upper side of the first planarization layer OC1. For example, the first electrode AE may be disposed on the first bank BNK1 disposed on the first planarization layer OC1 and cover the first bank BNK1. The first electrode AE may overlap one of the first to third light emitting areas LA1, LA2, and LA3 in a plan view. The first to third light emitting areas LA1, LA2, and LA3 may be defined by the second bank BNK2. The first electrode AE may be electrically connected to the drain electrode DE of the thin film transistor TFT.

The second electrode CE may be provided on an upper side of the first planarization layer OC1. For example, the second electrode CE may be disposed on the first bank BNK1 disposed on the first planarization layer OC1 and cover the first bank BNK1. The second electrode CE may overlap one of the first to third light emitting areas LA1, LA2, and LA3 in a plan view. The first to third light emitting areas LA1, LA2, and LA3 may be defined by the second bank BNK2. For example, the second electrode CE may receive a common voltage supplied to all pixels PX.

The first element insulating layer QPAS1 may cover a portion of the first electrode AE and a portion of the second electrode CE adjacent to each other, and may electrically insulate the first electrode AE and the second electrode CE.

The light emitting element ED may be disposed between the first electrode AE and the second electrode CE on the upper side of the first planarization layer OC1. The light emitting element ED may be disposed on the first element insulating layer QPAS1. An end of the light emitting element ED may be electrically connected to the first electrode AE, and another end of the light emitting element ED may be electrically connected to the second electrode CE. For example, the light emitting elements ED may include an active layer having a same material and emit light of a same wavelength band (or light of a same color). Light emitted from each of the first to third light emitting areas LA1, LA2, and LA3 may have a same color. For example, the light emitting elements ED may emit light of a third color or blue light having a peak wavelength in the range of about 440 nm to about 480 nm.

The second bank BNK2 may be disposed on the first planarization layer OC1 and define the first to third light emitting areas LA1, LA2, and LA3. For example, the second bank BNK2 may be adjacent to (e.g., surround) each of the first to third light emitting areas LA1, LA2, and LA3, but is not limited thereto. The second bank BNK2 may be disposed in the light blocking areas BA.

The second passivation layer PAS2 may be disposed on the light emitting members EL and the second bank BNK2. The second passivation layer PAS2 may cover the light emitting members EL and may protect the light emitting members EL.

The display device may further include the second planarization layer OC2, the first capping layer CAP1, the first light blocking member BK1, the first wavelength conversion portion WLC1, the second wavelength conversion portion WLC2, the light transmission portion LTU, the second capping layer CAP2, the third planarization layer OC3, the second light blocking member BK2, the first to third color filters CF1, CF2, and CF3, the third passivation layer PAS3, and the encapsulation member ENC.

The second planarization layer OC2 may be provided on an upper side of the light emitting element layer EML and planarize an upper end of the light emitting element layer EML. The second planarization layer OC2 may include an organic material.

The first capping layer CAP1 may be disposed on the second planarization layer OC2. The first capping layer CAP1 may seal bottom surfaces of the first and second wavelength conversion portions WLC1 and WLC2 and the light transmission portion LTU. The first capping layer CAP1 may include an inorganic material.

The first light blocking member BK1 may be disposed in the light blocking areas BA on the first capping layer CAP1.

The first light blocking member BK1 may overlap the second bank BNK2 in a thickness direction. The first light blocking member BK1 may block transmission of light.

The first light blocking member BK1 may include an organic light blocking material and a liquid repellent component.

As the first light blocking member BK1 includes the liquid repellent component, the first light blocking member BK1 may separate the first and second wavelength conversion portions WLC1 and WLC2 and the light transmission portion LTU into corresponding light emitting areas LA.

The first wavelength conversion portion WLC1 may be disposed in the first light emitting area LA1 on the first capping layer CAP1. The first wavelength conversion portion WLC1 may be adjacent to (e.g., be surrounded by) the first light blocking member BK1. The first wavelength conversion portion WLC1 may include a first base resin BS1, a first scatterer SCT1, and a first wavelength shifter WLS1.

The first base resin BS1 may include a material having a relatively high light transmittance. The first base resin BS1 may be made of a transparent organic material. For example, the first base resin BS1 may include at least one organic material of an epoxy-based resin, an acrylic resin, a cardo-based resin, and an imide-based resin.

The first scatterer SCT1 may have a refractive index different from that of the first base resin BS1, and may form an optical interface with the first base resin BS1.

The first wavelength shifter WLS1 may convert or shift a peak wavelength of incident light to a first peak wavelength. For example, the first wavelength shifter WLS1 may convert the blue light provided from the display device into red light having a single peak wavelength in the range of about 610 nm to about 650 nm and emit the red light. The first wavelength shifter WLS1 may be a quantum dot, a quantum rod, or a phosphor. The quantum dot of the first wavelength shifter WLS1 may be a particulate matter that emits a color (e.g., a specific or selectable color) by transition of electrons from a conduction band to a valence band.

The light emitted by the first wavelength shifter WLS1 may have a light emitting wavelength spectrum full width of half maximum (FWHM) of about 45 nm or less, or about 40 nm or less, or about 30 nm or less, and color purity and color reproducibility of colors displayed by the display device may be further improved.

A portion of the blue light provided from the light emitting element layer EML may be transmitted through the first wavelength conversion portion WLC1 without being converted into the red light by the first wavelength shifter WLS1. Light incident on the first color filter CF1 without being converted by the first wavelength conversion portion WLC1 in the blue light provided from the light emitting element layer EML may be blocked by the first color filter CF1. The red light converted by the first wavelength conversion portion WLC1 in the blue light provided from the display device may be transmitted through the first color filter CF1 and emitted to the outside. Accordingly, the first light emitting area LA1 may emit the red light.

The second wavelength conversion portion WLC2 may be disposed in the second light emitting area LA2 on the first capping layer CAP1. The second wavelength conversion portion WLC2 may be adjacent to (e.g., be surrounded by) the first light blocking member BK1. The second wavelength conversion portion WLC2 may include a second base resin BS2, a second scatterer SCT2, and a second wavelength shifter WLS2.

The second base resin BS2 may include a material having a relatively high light transmittance. The second base resin BS2 may be made of a transparent organic material.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light.

The second wavelength shifter WLS2 may convert or shift the peak wavelength of the incident light to a second peak wavelength different from the first peak wavelength of the first wavelength shifter WLS1. For example, the second wavelength shifter WLS2 may convert the blue light provided from the display device into green light having a single peak wavelength in the range of about 510 nm to about 550 nm and emit the green light. The second wavelength shifter WLS2 may be a quantum dot, a quantum rod, or a phosphor. The second wavelength shifter WLS2 and the first wavelength shifter WLS1 may include a same material.

The light transmission portion LTU may be disposed in the third light emitting area LA3 on the first capping layer CAP1. The light transmission portion LTU may be adjacent to (e.g., be surrounded by) the first light blocking member BK1. The light transmission portion LTU may transmit incident light therethrough and maintain a peak wavelength of the incident light. The light transmission portion LTU may include a third base resin BS3 and a third scatterer SCT3.

The third base resin BS3 may include a material having a relatively high light transmittance. The third base resin BS3 may be made of a transparent organic material.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light.

As the first and second wavelength conversion portions WLC1 and WLC2 and the light transmission portion LTU are disposed on the light emitting element layer EML through the second planarization layer OC2 and the first capping layer CAP1, the display device may not require a separate substrate for the first and second wavelength conversion portions WLC1 and WLC2 and the light transmission portion LTU.

The second capping layer CAP2 may cover the first and second wavelength conversion portions WLC1 and WLC2, the light transmission portion LTU, and the first light blocking member BK1.

The third planarization layer OC3 may be disposed on an upper side of the second capping layer CAP2 and planarize upper ends of the first and second wavelength conversion portions WLC1 and WLC2 and the light transmission portion LTU. The third planarization layer OC3 may include an organic material.

The second light blocking member BK2 may be disposed in the light blocking area BA on the third planarization layer OC3. The second light blocking member BK2 may overlap the first light blocking member BK1 and/or the second bank BNK2 in the thickness direction. The second light blocking member BK2 may block transmission of light.

The first color filter CF1 may be disposed in the first light emitting area LA1 on the third planarization layer OC3. The first color filter CF1 may be adjacent to (e.g., may be surrounded by) the second light blocking member BK2. The first color filter CF1 may overlap the first wavelength conversion portion WLC1 in the thickness direction. The first color filter CF1 may selectively transmit the light of the first color (e.g., the red light), and block or absorb the light of the second color (e.g., the greed light) and the light of the third color (e.g., the blue light).

The second color filter CF2 may be disposed in the second light emitting area LA2 on the third planarization layer OC3. The second color filter CF2 may be adjacent to (e.g., may be surrounded by) the second light blocking member BK2. The second color filter CF2 may overlap the second wavelength conversion portion WLC2 in the thickness direction. The second color filter CF2 may selectively transmit the light of the second color (e.g., the green light), and block or absorb the light of the first color (e.g., the red light) and the light of the third color (e.g., the blue light).

The third color filter CF3 may be disposed in the third light emitting area LA3 on the third planarization layer OC3. The third color filter CF3 may be adjacent to (e.g., may be surrounded by) the second light blocking member BK2. The third color filter CF3 may overlap the light transmission portion LTU in the thickness direction. The third color filter CF3 may selectively transmit the light of the third color (e.g., the blue light), and block or absorb the light of the first color (e.g., the red light) and the light of the second color (e.g., the green light).

The first to third color filters CF1, CF2, and CF3 may absorb a portion of light introduced from the outside of the display device and reduce light reflection (or reflected light) due to external light. Therefore, the first to third color filters CF1, CF2, and CF3 may prevent color distortion due to the reflection of the external light.

The third passivation layer PAS3 may cover the first to third color filters CF1, CF2, and CF3. The third passivation layer PAS3 may protect the first to third color filters CF1, CF2, and CF3.

The encapsulation member ENC may be disposed on the third passivation layer PAS3. For example, the encapsulation member ENC may include at least one inorganic film and prevent permeation of oxygen or moisture. The encapsulation member ENC may include at least one organic film and protect the display device from foreign matters such as dust.

Figure 3:
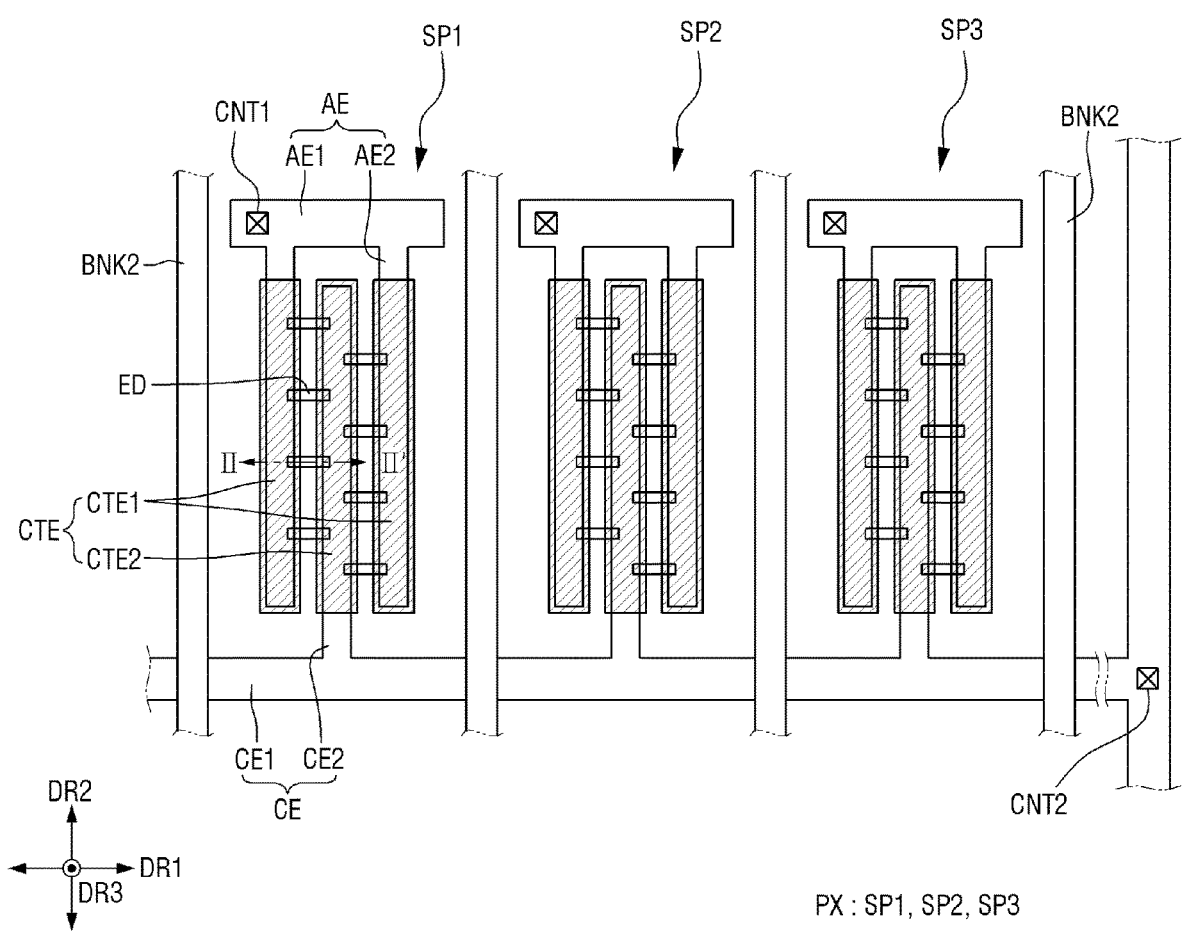
FIG. 3 is a schematic plan view illustrating a pixel of the display device according to an embodiment.
Figure 4:
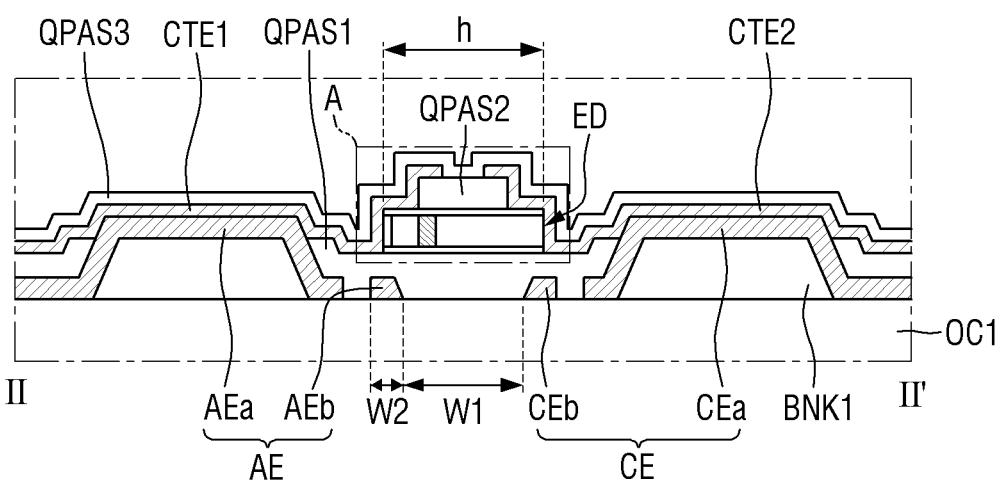
FIG. 4 is a schematic cross-sectional view taken along line II-IF of FIG. 3.
Figure 5:
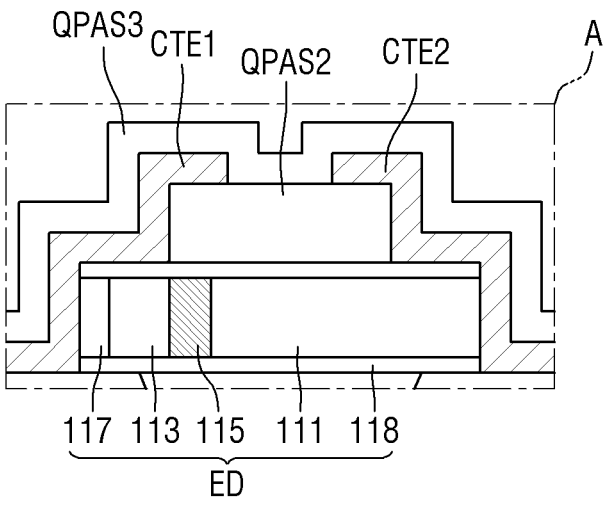
FIG. 5 is a schematic enlarged cross-sectional view of area A of FIG. 4.

FIG. 3 is a schematic plan view illustrating a pixel of the display device according to an embodiment. FIG. 4 is a schematic cross-sectional view taken along line II-IF of FIG. 3. FIG. 5 is a schematic enlarged cross-sectional view of area A of FIG. 4.

Referring to FIGS. 2 to 5, each of the pixels PX may include a first sub-pixel SP1, a second sub-pixel SP2, and a third sub-pixel SP3. Each of the first to third sub-pixels SP1, SP2, and SP3 may correspond to each of the first to third light emitting areas LA1, LA2, and LA3. The light emitting element ED of each of the first to third sub-pixels SP1, SP2, and SP3 may emit light through the first to third light emitting areas LA1, LA2, and LA3.

Each of the first to third sub-pixels SP1, SP2, and SP3 may emit light of a same color. For example, the light emitting element ED of each of the first to third sub-pixels SP1, SP2, and SP3 may be a same type, and may emit the light of the third color or the blue light. As another example, the first sub-pixel SP1 may emit the light of the first color or the red light, the second sub-pixel SP2 may emit the light of the second color or the green light, and the third sub-pixel SP3 may emit the light of the third color or the blue light.

Each of the first to third sub-pixels SP1, SP2, and SP3 may include the first and second electrodes AE and CE, the light emitting element ED, contact electrodes CTE, and the second banks BNK2.

The first and second electrodes AE and CE may be electrically connected to the light emitting element ED and applied with a voltage (e.g., a predetermined or selectable voltage). The light emitting element ED may emit light in a wavelength band (e.g., a specific or selectable wavelength band). At least a portion of the first and second electrodes AE and CE may form an electric field in the pixel, and the light emitting element ED may be aligned between the first and second electrodes AE and CE by the electric field.

For example, the first electrode AE may be a pixel electrode separated for each of the first to third sub-pixels SP1, SP2, and SP3, and the second electrode CE may be a common electrode commonly and electrically connected to the first to third sub-pixels SP1, SP2, and SP3. One of the first electrode AE and the second electrode CE may be an anode electrode of the light emitting element ED, and another thereof may be a cathode electrode of the light emitting element ED.

The first electrode AE may include a first electrode stem portion AE1 extending in the first direction DR1 and at least one first electrode branch portion AE2 branching from the first electrode stem portion AE1 and extending in the second direction DR2.

The first electrode stem portion AE1 of each of the first to third sub-pixels SP1, SP2, and SP3 may be spaced apart from another first electrode stem portion AE1 of an adjacent sub-pixel. The first electrode stem portion AE1 may be disposed on an imaginary extension line with the another first electrode stem portions AE1 of the adjacent sub-pixels adjacent to each other in the first direction DR1. The first electrode stem portions AE1 of the first to third sub-pixels SP1, SP2, and SP3 may receive different signals and may be independently driven.

The first electrode branch portion AE2 may branch from the first electrode stem portion AE1 and extend in the second direction DR2. An end of the first electrode branch portion AE2 may be electrically connected to the first electrode stem portion AE1, and another end of the first electrode branch portion AE2 may be spaced apart from a second electrode stem portion CE1 facing the first electrode stem portion AE1.

The second electrode CE may include the second electrode stem portion CE1 extending in the first direction DR1 and a second electrode branch portion CE2 branching from the second electrode stem portion CE1 and extending in the second direction DR2. The second electrode stem portion CE1 (e.g., a portion of the second electrode stem portion CE1) of each of the first to third sub-pixels SP1, SP2, and SP3 may be electrically connected to the second electrode stem portion CE1 (e.g., another portion of the second electrode stem portion CE1) of the adjacent sub-pixel. The second electrode stem portion CE1 may extend in the first direction DR1 and intersect (or cross) the pixels (e.g., the sub-pixels SP1, SP2, and SP3). The second electrode stem portion CE1 may be electrically connected to an outer portion of the display area DA or a portion extending in a direction from the non-display area NDA.

The second electrode branch portion CE2 may be spaced apart from the first electrode branch portion AE2 to face each other. An end of the second electrode branch portion CE2 may be electrically connected to the second electrode stem portion CE1, and another end of the second electrode branch portion CE2 may be spaced apart from the first electrode stem portion AE1.

The first electrode AE may be electrically connected to the thin film transistor layer TFTL of the display device through a first contact hole CNT1. The second electrode CE may be electrically connected to the thin film transistor layer TFTL of the display device through a second contact hole CNT2. For example, the first contact hole CNT1 may be disposed in each of the first electrode stem portions AE1, and the second contact hole CNT2 may be disposed in the second electrode stem portion CE1, but is not limited thereto.

The second bank BNK2 may be disposed at a boundary between the pixels. The first electrode stem portions AE1 may be spaced apart from each other based on the second bank BNK2. The second bank BNK2 may extend in the second direction DR2, and may be disposed at a boundary between the pixels (e.g., adjacent ones of the first to third sub-pixels SP1, SP2, and SP3) arranged in the first direction DR1. The second bank BNK2 may also be disposed at a boundary of the pixels PX arranged in the second direction DR2. The second bank BNK2 may define the boundary between the pixels (e.g., the first to third sub-pixels SP1, SP2, and SP3).

In case that the display device is manufactured, the light emitting elements ED may be dispersed in an ink and sprayed. The second bank BNK2 may prevent the ink from crossing the boundary between the pixels (e.g., the first to third sub-pixels SP1, SP2, and SP3) during the manufacturing of the display device. The second bank BNK2 may separate different light emitting elements ED from each other, and inks in which the different light emitting elements ED are dispersed may not mix with each other.

The light emitting element ED may be disposed between the first electrode AE and the second electrode CE. The end of the light emitting element ED may be electrically connected to the first electrode AE, and the another end of the light emitting element ED may be electrically connected to the second electrode CE.

The light emitting elements ED may be spaced apart from each other, and may be aligned in a direction (e.g., substantially parallel to each other). An interval between the light emitting elements ED spaced apart from each other is not limited thereto.

The light emitting elements ED may include active layers having a same material and emit light of a same wavelength band (or light of a same color). The first to third sub-pixels SP1, SP2, and SP3 may emit light of a same color. For example, the light emitting elements ED may emit light of a third color or blue light having a peak wavelength in the range of about 440 nm to about 480 nm.

The contact electrode CTE may include a first contact electrode CTE1 and a second contact electrode CTE2. The first contact electrode CTE1 may cover portions of the first electrode branch portion AE2 and the light emitting element ED, and may electrically connect the first electrode branch portion AE2 and the light emitting element ED to each other. The second contact electrode CTE2 may cover other portions of the second electrode branch portion CE2 and the light emitting element ED, and may electrically connect the second electrode branch portion CE2 and the light emitting element ED to each other.

The first contact electrode CTE1 may be disposed on the first electrode branch portion AE2 and extend in the second direction DR2. The first contact electrode CTE1 may be in contact with one end of the light emitting element ED. The light emitting element ED may be electrically connected to the first electrode AE through the first contact electrode CTE1.

The second contact electrode CTE2 may be disposed on the second electrode branch portion CE2 and extend in the second direction DR2. The second contact electrode CTE2 may be spaced apart from the first contact electrode CTE1 in the first direction DR1. The second contact electrode CTE2 may be in contact with the another end of the light emitting element ED. The light emitting element ED may be electrically connected to the second electrode CE through the second contact electrode CTE2.

The light emitting element layer EML of the display device may be disposed on the thin film transistor layer TFTL, and may include a first element insulating layer QPAS1, a second element insulating layer QPAS2, and a third element insulating layer QPAS3.

The first banks BNK1 may be disposed in the first to third light emitting areas LA1, LA2, and LA3, respectively. Each of the first banks BNK1 may correspond to the first electrode AE or the second electrode CE. Each of the first and second electrodes AE and CE may be disposed on the corresponding first bank BNK1. For example, the first banks BNK1 may be disposed on the first planarization layer OC1, and side surfaces of each of the first banks BNK1 may be inclined from the first planarization layer OC1. The inclined surface of the first bank BNK1 may reflect light emitted from the light emitting element ED.

The first electrode stem portion AE1 may include the first contact hole CNT1 penetrating through the first planarization layer OC1. The first electrode stem portion AE1 may be electrically connected to the thin film transistor TFT through the first contact hole CNT1.

The second electrode stem portion CE1 may extend in the first direction DR1 and may also be disposed in a non-light emitting area in which the light emitting element ED is not disposed. The second electrode stem portion CE1 may include the second contact hole CNT2 penetrating through the first planarization layer OC1. The second electrode stem portion CE1 may be electrically connected to a power electrode through the second contact hole CNT2. The second electrode CE may receive an electrical signal (e.g., a predetermined or selectable electrical signal) from the power electrode.

The first and second electrodes AE and CE may include a transparent conductive material. The first and second electrodes AE and CE may include a conductive material having a high reflectivity. The first and second electrodes AE and CE may have one or more stacked layers made of the transparent conductive material and one or more layers made of the metal having the high reflectivity. In other embodiments, the first and second electrodes AE and CE may be formed as one layer including the transparent conductive material and the metal having the high reflectivity.

The first element insulating layer QPAS1 may be disposed on the first planarization layer OC1, the first electrode AE, and the second electrode CE. The first element insulating layer QPAS1 may cover a portion of each of the first and second electrodes AE and CE.

The first element insulating layer QPAS1 may protect the first and second electrodes AE and CE, and electrically insulate the first and second electrodes AE and CE from each other. The first element insulating layer QPAS1 may prevent the light emitting element ED from being in direct contact with and being damaged by other members.

The light emitting element ED may be disposed between the first electrode AE and the second electrode CE, which are disposed on an upper side of the first element insulating layer QPAS1. The end of the light emitting element ED may be electrically connected to the first electrode AE, and the another end of the light emitting element ED may be electrically connected to the second electrode CE.

The second element insulating layer QPAS2 may be partially disposed on the light emitting element ED disposed between the first and second electrodes AE and CE. The second element insulating layer QPAS2 may be disposed on a central portion of a top surface of the light emitting element ED. The third element insulating layer QPAS3 may be adjacent to (e.g., partially surround) an outer surface of the light emitting element ED. The third element insulating layer QPAS3 may protect the light emitting element ED. The third element insulating layer QPAS3 may be adjacent to (e.g., surround) the outer surface of the light emitting element ED.

The contact electrode CTE may include the first and second contact electrodes CTE1 and CTE2. The first contact electrode CTE1 may cover portions of the first electrode branch portion AE2 and the light emitting element ED, and may electrically connect the first electrode branch portion AE2 and the light emitting element ED to each other. The second contact electrode CTE2 may cover other portions of the second electrode branch portion CE2 and the light emitting element ED, and may electrically connect the second electrode branch portion CE2 and the light emitting element ED to each other.

The first contact electrode CTE1 may be disposed on the first electrode branch portion AE2 and extend in the second direction DR2. The first contact electrode CTE1 may be in contact with the end of the light emitting element ED. The light emitting element ED may be electrically connected to the first electrode AE through the first contact electrode CTE1.

The first contact electrode CTE1 may be in direct contact with a top surface on an end side of the second element insulating layer QPAS2.

The second contact electrode CTE2 may be disposed on the second electrode branch portion CE2 and extend in the second direction DR2. The second contact electrode CTE2 may be spaced apart from the first contact electrode CTE1 in the first direction DR1. The second contact electrode CTE2 may be in contact with the another end of the light emitting element ED. The light emitting element ED may be electrically connected to the second electrode CE through the second contact electrode CTE2.

The second contact electrode CTE2 may be in direct contact with a top surface on another end side of the second element insulating layer QPAS2.

The first contact electrode CTE1 and the second contact electrode CTE2 may be disposed on a same layer. The first contact electrode CTE1 and the second contact electrode CTE2 may each expose a top surface of the central portion of the second element insulating layer QPAS2.

Each of the first contact electrode CTE1 and the second contact electrode CTE2 may include a conductive material.

The first electrode AE may include a first electrode portion AEa and a first pattern portion AEb. The first electrode portion AEa may overlap the first bank BNK1 in a plan view, and the first pattern portion AEb may be separated from the first electrode portion AEa. The second electrode CE may include a second electrode portion CEa and a second pattern portion CEb. The second electrode portion CEa may overlap in a plan view the first bank BNK1, and the second pattern portion CEb may be separated from the second electrode portion CEa.

The first pattern portion AEb may not overlap the first bank BNK1 in a plan view, and the second pattern portion CEb may not overlap the first bank BNK1 in a plan view.

The first pattern portion AEb may overlap the light emitting element ED in a plan view, and the second pattern portion CEb may overlap the light emitting element ED in a plan view.

According to an embodiment, the first pattern portion AEb and the first electrode portion AEa may be electrically separated. Each of the first electrode portion AEa and the first pattern portion AEb may be independently driven. A first power voltage V1 may be applied to each of the first pattern portion AEb and the first electrode portion AEa. Detailed description thereof is provided below.

Similarly, the second pattern portion CEb and the second electrode portion CEa may be electrically separated. Each of the second electrode portion CEa and the second pattern portion CEb may be independently driven. A second power voltage V2 may be applied to each of the second pattern portion CEb and the second electrode portion CEa. Detailed description thereof is provided below. The second power voltage V2 may be smaller than the first power voltage V1. The first power voltage V1 may be a high-level power voltage, and the second power voltage V2 may be a low-level power voltage.

The first pattern portion AEb may be disposed between the first electrode portion AEa and the second pattern portion CEb, and the second pattern portion CEb may be disposed between the second electrode portion CEa and the first pattern portion AEb.

A separation distance W1 between the first pattern portion AEb and the second pattern portion CEb may be in a range of about 0.7 times to about 1 time a length h of the light emitting element ED to be described later in FIG. 6. A width W2 of the first pattern portion AEb and a width W2 of the second pattern portion CEb may be equal to or smaller than about 0.2 times the length h of the light emitting element ED, respectively.

There are the following advantages. In case that the separation distance W1 between the first pattern portion AEb and the second pattern portion CEb is equal to or greater than about 0.7 times the length h of the light emitting element ED, even when misalignment (e.g., misalignment error lengths d1 and d2) of the light emitting element ED significantly occurs as described later with reference to FIGS. 8 and 9, an electric field formed by each of the first pattern portion AEb and the second pattern portion CEb may affect the misaligned light emitting element ED, which may increase a likelihood of exactly realigning the light emitting element. In case that the separation distance W1 between the first pattern portion AEb and the second pattern portion CEb is equal to or smaller than 1 time the length h of the light emitting element ED, a density of the electric field formed by the first pattern portion AEb and the second pattern portion CEb formed on a center line CL2 between the first electrode AE and the second electrode CE may be maintained at a level (e.g., a predetermined or selectable level) or more. In an embodiment, the separation distance W1 between the first pattern portion AEb and the second pattern portion CEb may be in a range of about 0.8 times to about 0.9 times the length h of the light emitting element ED. Detailed description thereof is provided below.

In the case in which the width W2 of the first pattern portion AEb and the width W2 of the second pattern portion CEb are equal to or smaller than about 0.2 times the length h of the light emitting element ED, respectively, path of electric fields formed between the first pattern portion AEb and the second pattern portion CEb may be reduced and prevent a meta-stable state in which the light emitting element ED is aligned in an area other than the center line CL2 between the first electrode AE and the second electrode CE from occurring, which may improve the exact alignment of the light emitting element ED.

Figure 6:
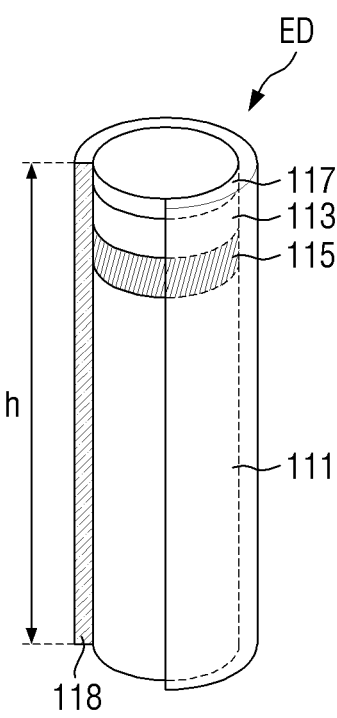
FIG. 6 is a schematic view illustrating a light emitting element according to an embodiment.

FIG. 6 is a schematic view illustrating a light emitting element according to an embodiment.

Referring to FIG. 6, the light emitting element ED may be a light emitting diode. The light emitting element ED may have a size of a micro-meter scale or a nano-meter scale, and may be an inorganic light emitting diode including an inorganic material. The inorganic light emitting diode of the light emitting element ED may be aligned between the two electrodes (e.g., between the first electrode AE and the second electrode CE) according to an electric field formed between the two electrodes facing each other in a direction (e.g., a specific or selectable direction).

The light emitting element ED may have a shape extending in a direction. The light emitting element ED may have a shape such as a rod, a wire, or a tube. The light emitting element ED may include a first semiconductor layer 111, a second semiconductor layer 113, an active layer 115, an electrode layer 117, and an insulating film 118.

The first semiconductor layer 111 may be an n-type semiconductor. The second semiconductor layer 113 may be disposed on the active layer 115. Each of the first and second semiconductor layers 111 and 113 may be configured as a layer, but is not limited thereto.

The active layer 115 may be disposed between the first and second semiconductor layers 111 and 113. The active layer 115 may include a material having a single or multiple quantum well structure. When the active layer 115 includes the material having the multiple quantum well structure, quantum layers and well layers may be alternately stacked each other.

Light emitted from the active layer 115 may be emitted in a length direction of the light emitting element ED, and may also be emitted from both sides thereof. A direction of the light emitted from the active layer 115 may not be limited thereto.

The electrode layer 117 may be an ohmic contact electrode. As another example, the electrode layer 117 may be a Schottky contact electrode. The light emitting element ED may include at least one electrode layer 117.

The insulating film 118 may be adjacent to (e.g., surround) outer surfaces of semiconductor layers and electrode layers. The insulating film 118 may be adjacent to (e.g., surround) an outer surface of the active layer 115 and may extend in a direction in which the light emitting element ED extends. The insulating film 118 may protect the light emitting element ED.

The insulating film 118 may include materials having at least one insulating material of silicon oxide (SiOx), silicon nitride (SiNx), silicon oxynitride (SiOxNy), aluminum nitride (AlN), and aluminum oxide (Al₂O₃).

An outer surface of the insulating film 118 may be surface-treated. When the display device is manufactured, the light emitting element ED may be sprayed and aligned onto the electrode in a state of being dispersed in an ink (e.g., a predetermined or selectable ink).

Figure 7:
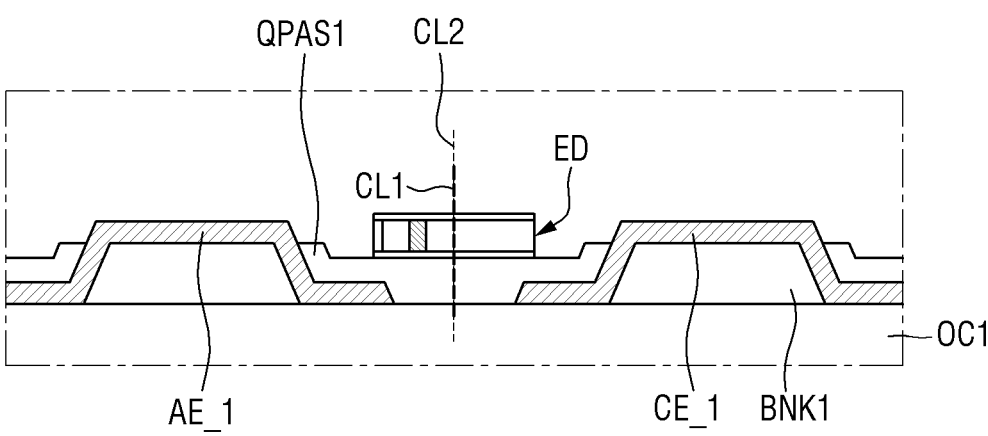
FIGS. 7 to 9 are schematic views illustrating exact alignment and misalignment of a light emitting element according to comparative examples.
Figure 8:
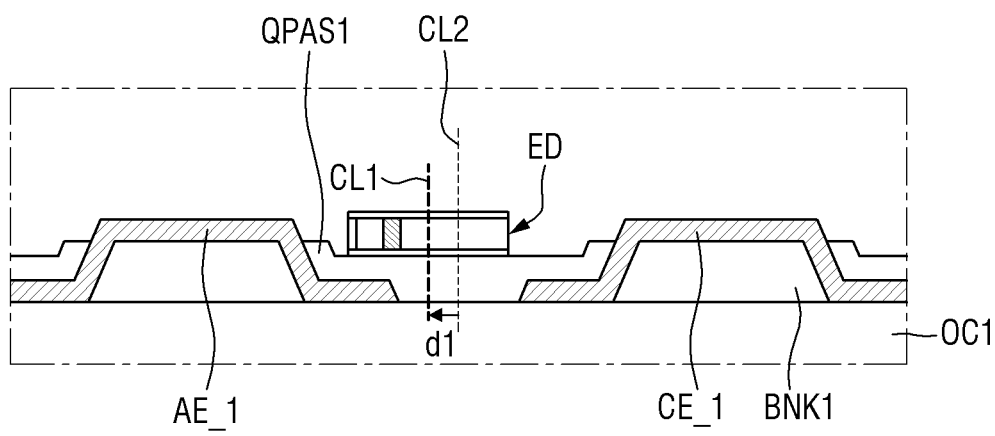
Figure 9:
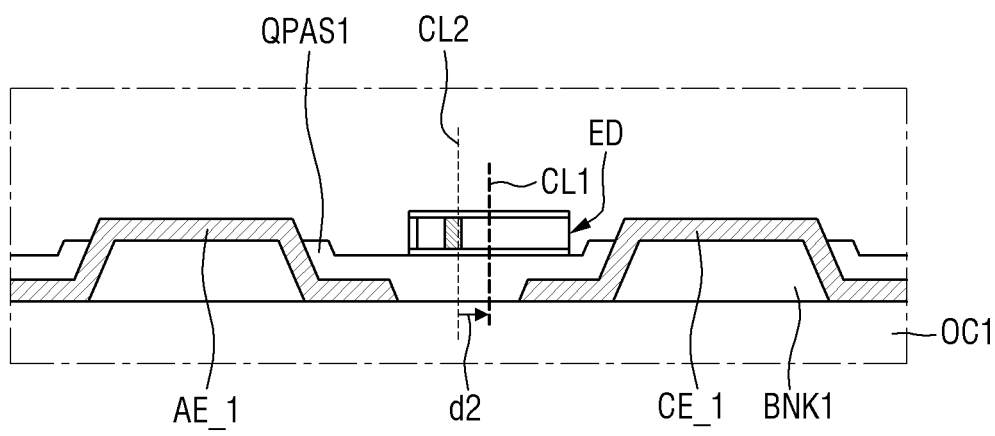
Figure 10:
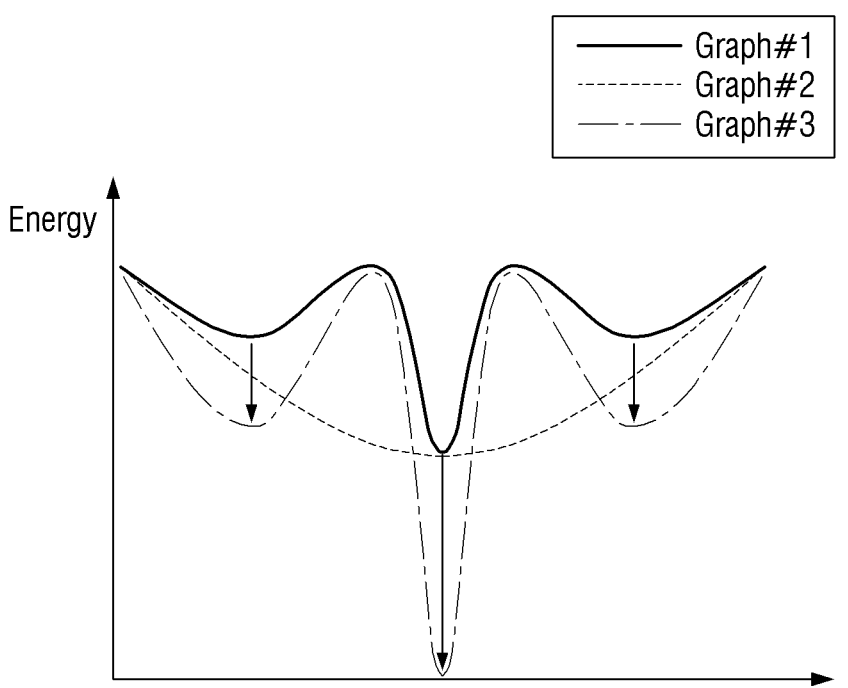
FIG. 10 is a graph for schematically illustrating the exact alignment and misalignment of the light emitting element.

FIGS. 7 to 9 are schematic views illustrating exact alignment and misalignment of a light emitting element according to comparative examples. FIG. 10 is a graph for schematically describing the exact alignment and misalignment of the light emitting element.

In FIGS. 7 to 9, a first bisecting line CL1 dividing the light emitting element ED into equal parts and a second bisecting line CL2 dividing a space between an end of the first electrode AE_1 and an end of the second electrode CE_1 into equal parts are illustrated. In FIG. 10, a graph #1 may be a graph when a first power voltage (e.g., a predetermined or selectable first power voltage) is applied to the first electrode AE_1 of FIGS. 7 to 9 and a second power voltage (e.g., a predetermined or selectable second power voltage) is applied to the second electrode CE_1 thereof. A graph #3 may be a graph when a power voltage greater than the first power voltage is applied to the first electrode AE_1 of FIGS. 7 to 9 and a power voltage smaller than the second power voltage is applied to the second electrode CE_1 thereof. A graph #2 may be a graph when a first power voltage (e.g., a predetermined or selectable first power voltage) is applied to only the first pattern portion AEb of the first electrode AE according to FIG. 4 and a power voltage (e.g., a predetermined or selectable power voltage) is applied to only the second pattern portion CEb of the second electrode CE.

Referring to FIG. 7, the first bisecting line CL1 may be on a same line as the second bisecting line CL2, and indicate that the light emitting element ED is exactly aligned.

In FIG. 8, the light emitting element ED may be misaligned to the left because the first bisecting line CL1 is closer to the first electrode AE_1 than the second bisecting line CL2 (error distance d1).

In FIG. 9, the light emitting element ED may be misaligned to the right because the first bisecting line CL1 is closer to the second electrode CE_1 than the second bisecting line CL2 (error distance d2).

Referring to FIGS. 7 to 9 and graph #1 of FIG. 10, when the electrodes AE_1 and CE_1 according to FIGS. 7 to 9 are applied, three sections may have low potential energy. In case that the electrodes AE_1 and CE_1 are exactly aligned light emitting element ED of FIG. 7, a low potential energy of graph #1 may correspond to a center of the three sections. In case that the light emitting element ED is misaligned to the left in FIG. 8, a low potential energy of graph #1 may correspond to the left of the three sections. In case that the light emitting element ED is misaligned to the right in FIG. 9, a low potential energy of graph #1 may correspond to the right of the three sections.

As confirmed in graph #3 of FIG. 10, when a larger voltage is applied to the first electrode AE_1 and a smaller voltage is applied to the second electrode CE_1, the energy of the sections corresponding to the left and right of the three sections with low potential energy of graph #1 may be lowered.

However, when the electrodes AE and CE according to an embodiment are applied, a section having a low potential energy may be positioned at only a center, and a possibility of exact alignment of the light emitting element ED may be increased. In other embodiments, the misaligned light emitting element ED may be readily and exactly aligned.

Hereinafter, description of aligning the light emitting element in the method of manufacturing a display device according to an embodiment is provided below.

Figure 11:
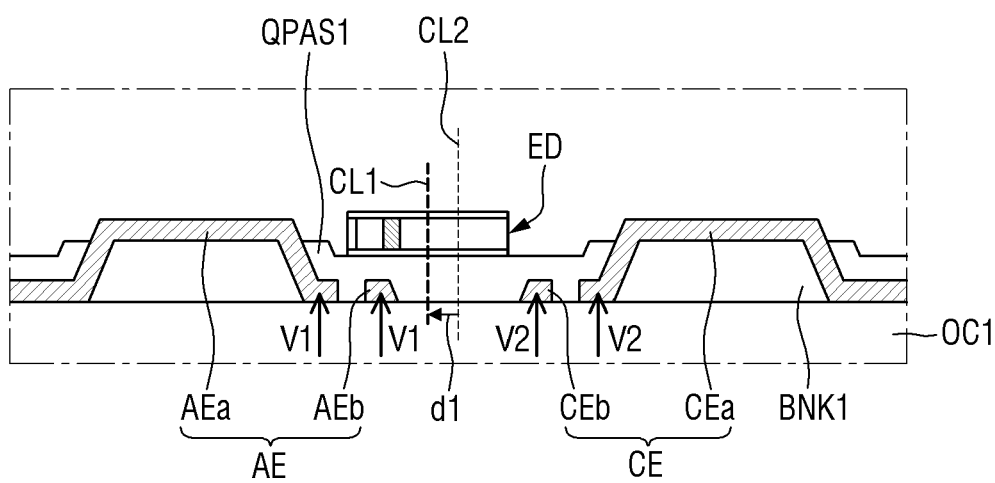
FIGS. 11 and 12 are schematic views illustrating aligning a light emitting element in a method of manufacturing a display device according to an embodiment.
Figure 12:
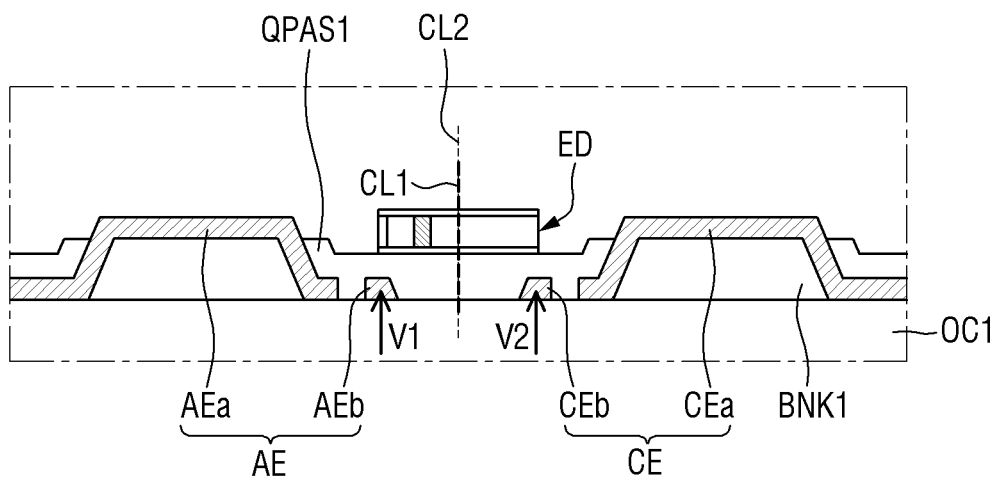
Figure 13:
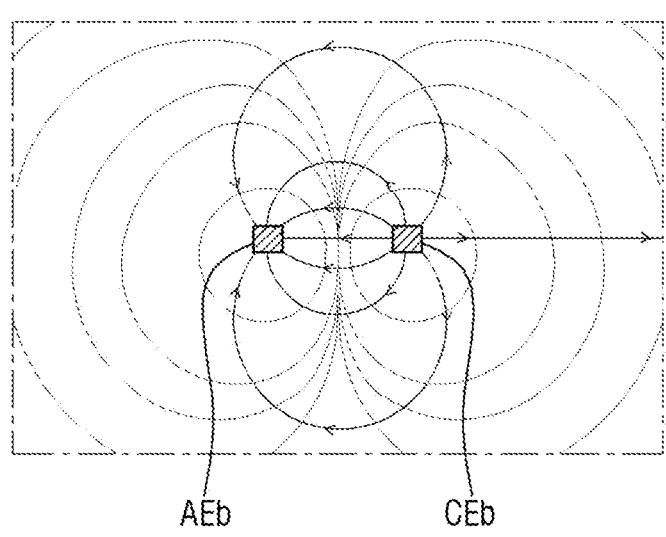
FIG. 13 is a schematic view illustrating an electric field by a first pattern portion and a second pattern portion of FIG. 11.
Figure 14:
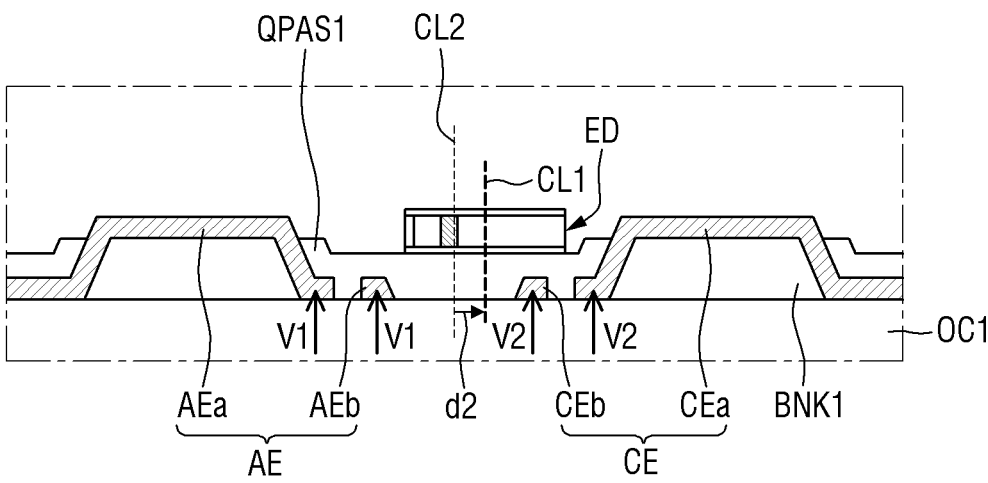
FIG. 14 is a schematic view illustrating aligning a light emitting element in a method of manufacturing a display device according to an embodiment.

FIGS. 11 and 12 are schematic views illustrating aligning a light emitting element in a method of manufacturing a display device according to an embodiment. FIG. 13 is a schematic view illustrating an electric field by a first pattern portion and a second pattern portion of FIG. 11. FIG. 14 is a schematic view illustrating aligning a light emitting element in a method of manufacturing a display device according to an embodiment. The aligning of the light emitting element in the method of manufacturing the display device according to the embodiment is described with reference to FIGS. 1 to 5 and 11 to 14.

The method of manufacturing a display device according to an embodiment includes preparing a target substrate including first banks BNK1, a first electrode AE, and a second electrode CE, and jetting ink including light emitting elements ED disposed between the first electrode AE and the second electrode CE. The first banks BNK1 may be spaced apart from each other on a substrate SUB. The first electrode AE and the second electrode CE may be disposed on the first banks BNK1 and cover the first banks BNK1. The first electrode AE and the second electrode CE may be spaced apart from each other. The first electrode AE may include a first electrode portion AEa and a first pattern portion AEb. The first electrode portion AEa may overlap the first bank BNK1 in a plan view. The first pattern portion AEb may be separated from the first electrode portion AEa. The second electrode CE may include a second electrode portion CEa and a second pattern portion CEb. The second electrode portion CEa may overlap the first bank BNK1 in a plan view, and the second pattern portion CEb may be separated from the second electrode portion CEa.

As illustrated in FIG. 11, after the jetting of the ink including the light emitting elements ED disposed between the first electrode AE and the second electrode CE, the first power voltage V1 may be applied to the first electrode portion AEa and the first pattern portion AEb, and a second power voltage V2 may be applied to the second electrode portion CEa and the second pattern portion CEb.

Thereafter, as illustrated in FIG. 12, the first power voltage V1 may be applied only to the first pattern portion AEb, and the second power voltage V2 may be applied only to the second pattern portion CEb. As a result, as illustrated in FIG. 12, the light emitting element ED misaligned in FIG. 11 may be exactly aligned.

For convenience of explanation (although not intended to limit the disclosure by theorical explanation), the reason that the light emitting element ED misaligned in FIG. 11 is exactly aligned is provided below. The first power voltage V1 may only be applied to the first pattern portion AEb and the second power voltage V2 may only be applied to the second pattern portion CEb. Thus, a section with a low potential energy may be positioned in only the place in the center as illustrated in FIGS. 10 and 13, and the light emitting element ED misaligned in FIG. 11 may be exactly aligned. For example, in case that the first power voltage V1 is only applied to the first pattern portion AEb and the second power voltage V2 is only applied to the second pattern portion CEb, the misaligned light emitting elements ED (e.g., refer to FIG. 11) may be transformed to be exactly aligned because the section of the low potential energy may only be positioned in the center thereof with reference to FIGS. 10 and 13.

The light emitting element ED of FIG. 14 is different from the light emitting element ED of FIG. 11 at least in that the light emitting element ED is misaligned in a different direction. Thus, detailed description of the same constituent elements is omitted.

Figure 15:
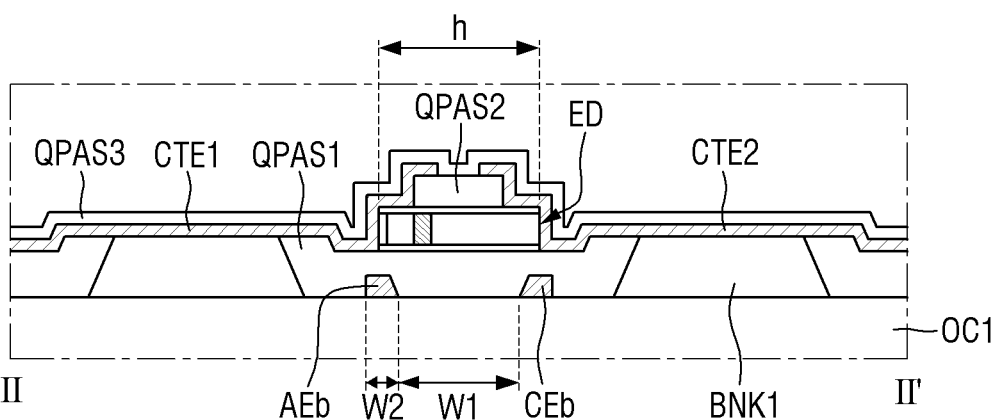
FIG. 15 is a schematic cross-sectional view of a display device according to another embodiment.

FIG. 15 is a schematic cross-sectional view of a display device according to another embodiment.

The display device according to the embodiment of FIG. 15 is different from the display device according to FIG. 4 at least in that the first electrode portion AEa and the second electrode portion CEa may be omitted.

Since other descriptions have been made with reference to FIG. 4, detailed description of the same constituent elements is omitted.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
banks spaced apart from each other on a substrate;
a first electrode disposed on the banks;
a second electrode disposed on the banks, and spaced apart from the first electrode; and
a light emitting element disposed on the first electrode and the second electrode, wherein
the first electrode and the second electrode cover the banks,
the first electrode includes:
a first electrode portion overlapping the banks in a plan view; and
a first pattern portion separated from the first electrode portion, and
the second electrode includes:
a second electrode portion overlapping the banks in a plan view; and
a second pattern portion separated from the second electrode portion,
wherein:
a separation distance between the first pattern portion and the second pattern portion is in a range of about 0.7 times to about 1 time a length of the light emitting element; or
a width of the first pattern portion and a width of the second pattern portion are equal to or smaller than about 0.2 times the length of the light emitting element.

2. The display device of claim 1, wherein
the first pattern portion does not overlap the banks in a plan view, and
the second pattern portion does not overlap the banks in a plan view.

3. The display device of claim 2, wherein
the first pattern portion overlaps the light emitting element in a plan view, and
the second pattern portion overlaps the light emitting element in a plan view.

4. The display device of claim 3, wherein the first pattern portion and the first electrode portion are electrically separated from each other.

5. The display device of claim 4, wherein the first electrode portion and the first pattern portion are independently driven.

6. The display device of claim 5, wherein the second pattern portion and the second electrode portion are electrically separated from each other.

7. The display device of claim 6, wherein the second electrode portion and the second pattern portion are independently driven.

8. The display device of claim 6, wherein
the first pattern portion is disposed between the first electrode portion and the second pattern portion, and
the second pattern portion is disposed between the second electrode portion and the first pattern portion.

9. The display device of claim 8, wherein the separation distance between the first pattern portion and the second pattern portion is in the range of about 0.7 times to about 1 time the length of the light emitting element.

10. The display device of claim 8, wherein the width of the first pattern portion and the width of the second pattern portion are equal to or smaller than about 0.2 times the length of the light emitting element.

11. The display device of claim 1, further comprising:
a first contact electrode electrically connected to the first electrode and in contact with an end of the light emitting element.

12. The display device of claim 11, further comprising:
a second contact electrode electrically connected to the second electrode and in contact with another end of the light emitting element.

13. A display device comprising:
banks spaced apart from each other on a substrate;
a first electrode disposed on the substrate;
a second electrode disposed on the substrate and spaced apart from the first electrode; and
a light emitting element disposed on the first electrode and the second electrode,
wherein the first electrode and the second electrode do not overlap the banks in a plan view, respectively, and
wherein:
a separation distance between the first electrode and the second electrode is in a range of about 0.7 times to about 1 time a length of the light emitting element; or
a width of the first electrode and a width of the second electrode are equal to or smaller than about 0.2 times the length of the light emitting element.

14. The display device of claim 13, wherein
the first electrode overlaps the light emitting element in a plan view, and
the second electrode overlaps the light emitting element in a plan view.

15. The display device of claim 14, wherein the separation distance between the first electrode and the second electrode is in the range of about 0.7 times to about 1 time the length of the light emitting element.

16. The display device of claim 14, wherein the width of the first electrode and the width of the second electrode are equal to or smaller than about 0.2 times the length of the light emitting element, respectively.

17. A method of manufacturing a display device, the method comprising:
preparing a target substrate including:
banks spaced apart from each other on a substrate;
a first electrode disposed on the banks, the first electrode including:
a first electrode portion overlapping the banks in a plan view; and
a first pattern portion separated from the first electrode portion; and
a second electrode disposed on the banks, and spaced apart from the first electrode, the second electrode including:

a second electrode portion overlapping the banks in a
plan view; and a second pattern portion separated from the second
electrode portion; and jetting ink including a plurality of light emitting elements
disposed on the first electrode and the second electrode, wherein the first and second electrodes cover the banks,
and wherein the method further comprises driving only the
first pattern portion with a first power voltage and
driving only the second pattern portion with a second
power voltage.

18. The method of claim 17, further comprising, after the
jetting of the ink including the plurality of light emitting
elements disposed on the first electrode and the second
electrode, applying the first power voltage to the first electrode
portion and the first pattern portion; and applying the second power voltage to the second electrode
portion and the second pattern portion.

19. The method of claim 18, wherein the driving only the
first pattern portion with the first power voltage and driving
only the second pattern portion with the second power
voltage occurs after the applying of the first power voltage
to the first electrode portion and the first pattern portion, and
the applying of the second power voltage to the second
electrode portion and the second pattern portion.

20. The method of claim 19, wherein the first pattern portion is disposed between the first
electrode portion and the second pattern portion, and the second pattern portion is disposed between the second
electrode portion and the first pattern portion.

* * * * *